US006432811B1

United States Patent
Wong

(10) Patent No.: US 6,432,811 B1
(45) Date of Patent: Aug. 13, 2002

(54) METHOD OF FORMING STRUCTURAL REINFORCEMENT OF HIGHLY POROUS LOW K DIELECTRIC FILMS BY CU DIFFUSION BARRIER STRUCTURES

(75) Inventor: Lawrence D. Wong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/747,701

(22) Filed: Dec. 20, 2000

(51) Int. Cl.[7] ............... H01L 21/4763; H01L 21/44; H01L 21/31
(52) U.S. Cl. ............... 438/619; 438/627; 438/633; 438/638; 438/687; 438/780
(58) Field of Search ............... 438/687, 618, 438/619, 633, 627, 643, 653, 680, 724, 725, 744, 751, 780, 782

(56) References Cited

U.S. PATENT DOCUMENTS 5,461,003 A * 10/1995 Havermann et al. ........ 438/666
6,004,863 A * 12/1999 Jang ............... 438/427

* cited by examiner

*Primary Examiner*—Ha Tran Nguyen
(74) *Attorney, Agent, or Firm*—Blakley, Sokoloff, Taylor & Zafman LLP

(57) ABSTRACT

Highly porous, low-k dielectric materials are mechanically reinforced to enable the use of these low-k materials as intralayer and interlayer dielectrics in advanced integrated circuits such as those which incorporate highly porous materials in a Cu damascene interconnect technology. An integrated circuit, embodying such a mechanically reinforced dielectric layer generally includes a substrate having interconnected electrical elements therein, a copper-diffusion barrier or etch stop layer disposed over the substrate, the copper-diffusion barrier or etch stop layer being patterned so as to provide a plurality of electrically insulating structures, and a low-k dielectric layer disposed around the plurality of structures. A process, for making a mechanically reinforced, highly porous, low-k dielectric layer, generally includes forming a copper-diffusion or etch stop layer on a substrate, patterning the copper-diffusion or etch stop layer such that a plurality of structures are formed, the structures each having a top surface, forming a low-k dielectric layer over and adjacent to the structures, the low-k dielectric layer having a top surface, and polishing the low-k dielectric layer such that its top surface is substantially even with the top surfaces of the structures. The structures may be rectangular posts, or more geometrically complex forms. The structures may be identical, or a combination of various forms.

12 Claims, 6 Drawing Sheets

METHOD OF FORMING STRUCTURAL REINFORCEMENT OF HIGHLY POROUS LOW K DIELECTRIC FILMS BY CU DIFFUSION BARRIER STRUCTURES

BACKGROUND OF THE INVENTION

1. Field of the Invention

The present invention relates generally to integrated circuits and fabrication methods, and more particularly to the formation of integrated circuits with insulation layers having low dielectric constants.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide.

A consequence of having of patterned conductive material separated by an insulating material, whether the conductive material is on a single level or multiple levels, is the formation of undesired capacitors. The parasitic capacitance between patterned conductive material, or more simply, interconnects, separated by insulating material on microelectronic devices contributes to effects such as RC delay, unnecessary power dissipation, and capacitively coupled signals, also known as cross-talk.

One way to reduce the unwanted capacitance between the interconnects is to increase the distance between them. Increased spacing between interconnect lines has adverse consequences, such as increased area requirements and the corresponding increases in manufacturing costs. Another way to reduce the unwanted capacitance between the interconnects is to use an insulating material with a lower dielectric constant.

What is needed is a structure providing low parasitic capacitance between patterned conductors, and methods of making such a structure.

SUMMARY OF THE INVENTION

The present invention is a process of forming reinforcement structures from a copper diffusion barrier for use in highly porous dielectric layers of integrated circuits. According to the present invention the process involves forming an electrically non-conductive copper diffusion barrier on a substrate and then patterning the barrier to form reinforcement structures. A highly porous dielectric layer is then formed over the reinforcement structures and subsequently polishing the dielectric layer so that its surface is even with the top surfaces of the reinforcement structures.

DETAILED DESCRIPTION

Figure 1:
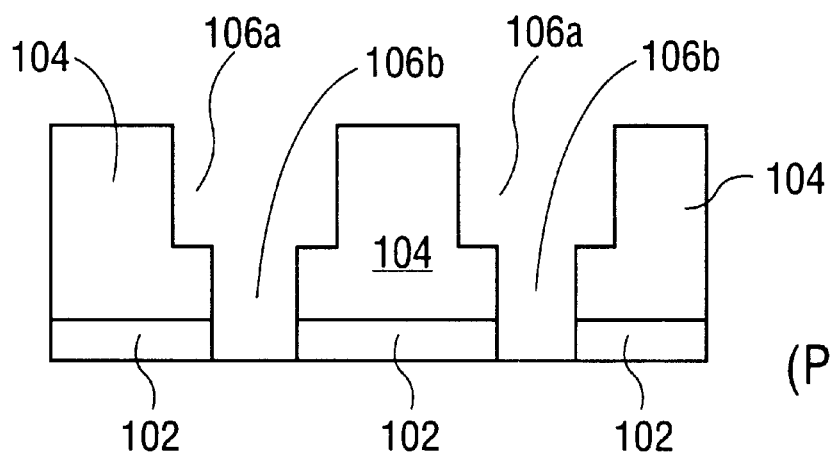
FIG. 1 is a schematic cross-section of a partially processed substrate showing a dual damascene opening formed in a composite interlayer dielectric having first and second layers in accordance with a prior art method.

Mechanically reinforced interlayer dielectric structures and methods of manufacturing such structures are described. Such mechanically reinforced interlayer dielectric structures are useful for, at least, integrated circuits having highly porous low-k interlayer dielectrics. In the following description, numerous specific details are set forth to provide an understanding of the present invention. It will be apparent however, to those skilled in the art and having the benefit of this disclosure, that the present invention may be practiced with apparatus, compositions, and processes that vary from those specified herein.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Terminology

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), cobalt (Co), nickel (Ni), tungsten (W), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure, contact and via refer to the completed structure.

Dishing, as used herein, refers to an amount of material, typically the metal of a metal damascene structure, that is removed during the polishing of the metal damascene structure. Dishing is similar to recess in that it represents an overpolishing of the metal (i.e., excess material removal), however dishing typically results in a parabolic or concave shaped metal surface and is due to a mechanical interaction as the polish pad bends into the damascene structure. Dishing is measured as a thickness, or distance, and more particularly, it is a measure of the distance between the post-polish surface of the interlayer dielectric and the post-polish surface of the metal.

Erosion, as used herein, refers to the amount of a layer, typically an interlayer dielectric, that is removed during the polishing of a metal damascene structure. Erosion is measured as a thickness, or distance, and more particularly, it is a measure of the distance between the original surface of the layer and its post-polish surface. Erosion is generally an undesirable result of overpolishing.

The expression, low dielectric constant material, refers to materials having a lower dielectric constant than silicon dioxide. For example, organic polymers, amorphous fluorinated carbons, nanofoams, silicon based insulators containing organic polymers, carbon doped oxides of silicon, and fluorine doped oxides of silicon have lower dielectric constants than silicon dioxide.

The letter k, is often used to refer to dielectric constant. Similarly, the terms high-k, and low-k, are used in this field to refer to high dielectric constant and low dielectric constant respectively. High and low are relative to the dielectric constant of $SiO_2$.

The term intralayer dielectric as used in this field is understood to refer to the dielectric material disposed between interconnect lines on a given interconnect level. That is, an intralayer dielectric is found between adjacent interconnect lines, rather than vertically above or below those interconnect lines.

The term vertical, as used herein, means substantially perpendicular to the surface of a substrate.

Highly porous, low-k dielectric materials having desirable electrical characteristics are provided with mechanically reinforcing structures to provide the additional strength for withstanding subsequently occurring, physically demanding process operations. Such process operations include, but are not limited to, those encountered in damascene metallization processes. These low-k dielectric materials are often used in integrated circuits to form inter-layer dielectric (ILD) layers.

The parasitic capacitance seen by an interconnect line is a function of the distance to another conductor and the dielectric constant of the material therebetween. However, increasing the spacing between interconnect lines increases the physical size, and thus the cost, of an integrated circuit. Therefore, in order to manufacture integrated circuits with low parasitic capacitance between interconnect lines, it is desirable to electrically isolate the conductors from each other with an insulator having a low dielectric constant.

One way to reduce the adverse effects of parasitic capacitance (e.g., RC interconnect delay) is to, as mentioned above, use low-k materials as insulators in advanced microelectronics products (e.g., integrated circuits). To achieve low dielectric constants, a manufacturer can either use a material which inherently possesses a low dielectric constant, and/or the manufacturer can introduce porosity into the material. Unfortunately, by increasing the film void fraction, which may be referred to as porosity, the thermal-mechanical properties of the material may be degraded.

Process integration of a highly porous ILD film, or layer, in a Cu damascene interconnect structure is a demanding challenge. For instance, the use of chemical mechanical polishing (CMP) to remove excess Cu in a damascene metallization process can induce mechanical failures which result in delamination or tearing of the underlying ILD layers. Control of both the erosion and dishing of the Cu lines will strongly determine the amount of shear imposed to these weaker ILD materials. Similarly, packaging can subject interconnect layers to severe shear and normal forces. Workarounds have been devised to improve the robustness of the porous ILD layers with respect to the stresses introduced by the CMP of Cu. One example workaround is to introduce "dummy" metal features at the trench level to improve CMP uniformity (i.e., reduce over-polish by creating uniform clearing between dense and non-dense line features). Inclusion of so-called "dummification" features at the via layers are a more challenging task due to limitations of creating redundant vias as heat sinks to control metal self-heating.

In accordance with the present invention, highly porous materials can be integrated into a Cu damascene interconnect structure. In one embodiment of the present invention, a process includes the formation of posts (alternatively referred to as pillars). These posts extend through highly porous ILD material to the same extent that the via and metal layers extend therethrough. This provides mechanical reinforcement for the ILD stack. These posts may also act as thermal conduits for improved heat removal. However, because the posts typically have a dielectric constant that is greater than the dielectric constant of the porous low-k dielectric, the tradeoff in capacitance effects depends upon the placement of the posts and their material composition.

Creation of mesoporous (nanoporous) low-k materials can be achieved by several known methods. For example, such porous films can be engineered as aerogels/xerogels (by sol-gel, templating processes, CVD, etc.) with either open or closed pore structures. In such films the pore radius and void fraction can be modulated by the choice of precursors and conditioning techniques. Because the mechanical strength of a film tends to decrease as porosity is increased, processes such as e-beam, or UV flood exposure, have been developed to increase the mechanical strength (such as hardness/modulus, or fracture toughness) of the film. However, these processes can degrade the film dielectric constant (i.e., increase the dielectric constant) by increasing the film density or the extent of cross-linking in the low-k material. Additionally, films that are highly porous may not even be susceptible to sufficient film strengthening by these processes.

Figure 2:
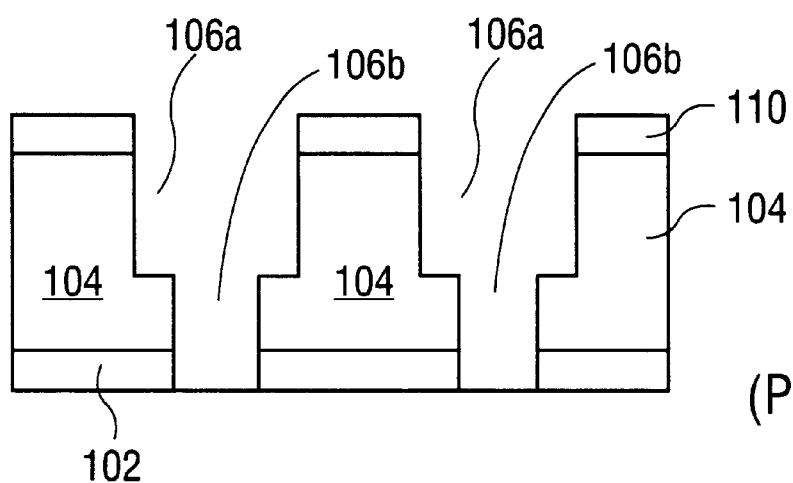
FIG. 2 is a schematic cross-section of a partially processed substrate showing a dual damascene opening formed in a composite interlayer dielectric having first, second, and third layers in accordance with a prior art method.
Figure 3:
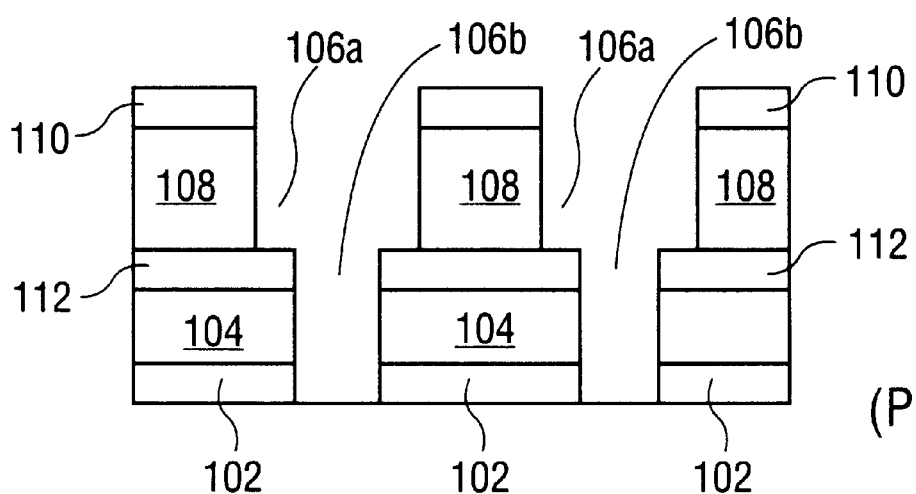
FIG. 3 is a schematic cross-section of a partially processed substrate showing a dual damascene opening formed in a composite interlayer dielectric having first, second, third, fourth, and fifth layers in accordance with a prior art method.

FIGS. 1–3 illustrate problematic approaches to providing a low-k insulating material between interconnect lines formed in a damascene process. FIG. 1 shows a carbon doped oxide (CDO) of silicon which, while possessing a dielectric constant less than that of silicon dioxide, does not provide the same level of improvement as do various polymer dielectrics and highly porous dielectric materials. With respect to FIGS. 2 and 3, the bulk of the dielectric layer is comprised of a spin-on polymer, or other type of low-k dielectric such as a highly porous material, and the remainder of the dielectric layer is comprised of one more relatively thin layers of alternative dielectric material. In each of the structures shown in FIGS. 2 and 3, there is limited resistance to lateral shearing forces, such as may be encountered during various integrated circuit manufacturing processes.

In one illustrative embodiment of the present invention, silicon nitride posts, are used to provide mechanical reinforcement of the comparatively weak, highly porous dielectric material which makes up the bulk of the ILD. More particularly, these posts provide the mechanical strength necessary to stand up to the stresses created by chemical mechanical polishing. It should be noted that the composition of the posts is not limited to silicon nitride, and other suitable materials include, but are not limited to, SiOC, SiC, and a-CN:H.

Figure 4:
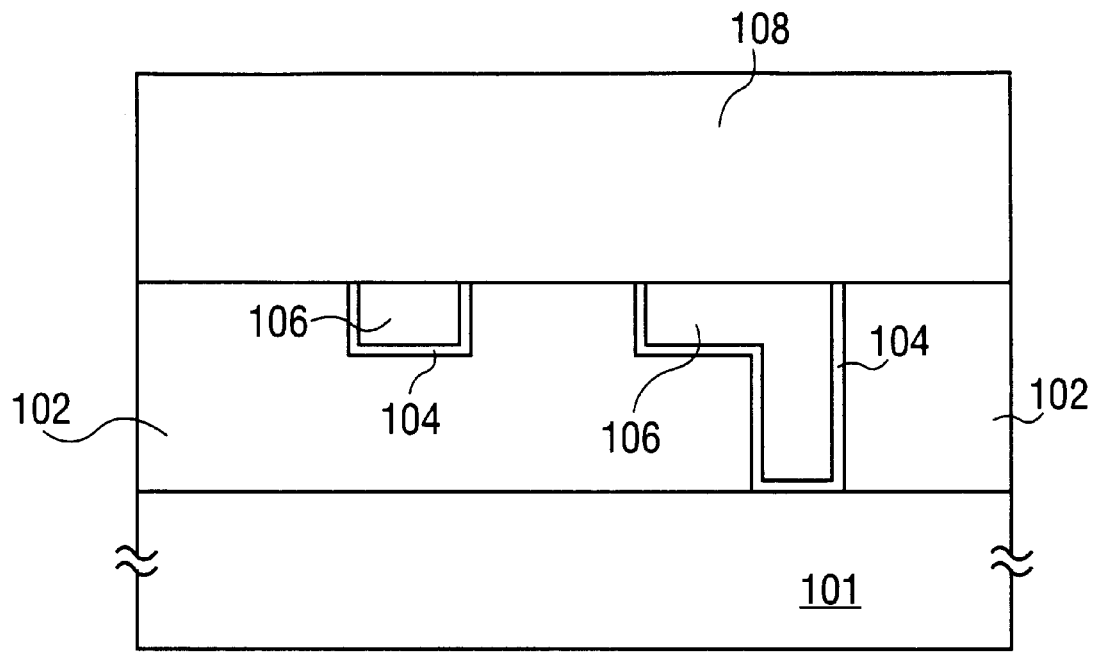
FIG. 4 is a schematic cross-section of a partially processed substrate having a first interconnect layer, and a thick copper-diffusion barrier layer overlying the first interconnect layer.

Referring to FIG. 4, a cross-section of a partially processed wafer is shown including a portion of a substrate 101 which contains various electrical circuit elements, a first dielectric layer 102, disposed over substrate 101 and having copper-based interconnect lines including copper-diffusion barriers 104 and copper, or copper alloy interior portions 106 disposed therein, and a thick copper-diffusion barrier layer 108 disposed over first dielectric layer 102 and the copper-based interconnect lines. FIG. 4, does not show details of the portion of the substrate 101 in which various circuit elements such as transistors are formed. Those skilled in the art and having the benefit of this disclosure will appreciate that the formation of such circuit elements is well known and their formation and structure will not be described further. First dielectric layer 102 is typically formed from materials such as, but not limited to, fluorine doped oxides of silicon, carbon doped oxides of silicon, or other suitable electrically insulating materials that preferably have a dielectric constant lower than that of silicon dioxide. First dielectric layer 102 may be formed over an ILD layer in which metal filled trenches and vias have previously been formed.

Still referring to FIG. 4, thick copper-diffusion barrier layer 108 may be used to substantially reduce or prevent the diffusion of copper atoms from underlying copper or copper alloy interconnects 106 into a yet to be formed dielectric layer which will overlie interconnects 106. This material may also be useful as an etch stop layer that is used in the formation of via openings. Because this material can be used for either or both of these purposes, it is generally referred to herein as the copper-diffusion barrier or etch stop layer. It should be understood, that either or both of those functions may be achieved by this layer. Copper-diffusion barrier or etch stop layer 108 is preferably an electrically non-conductive material, i.e., an electrical insulator.

Figure 5:
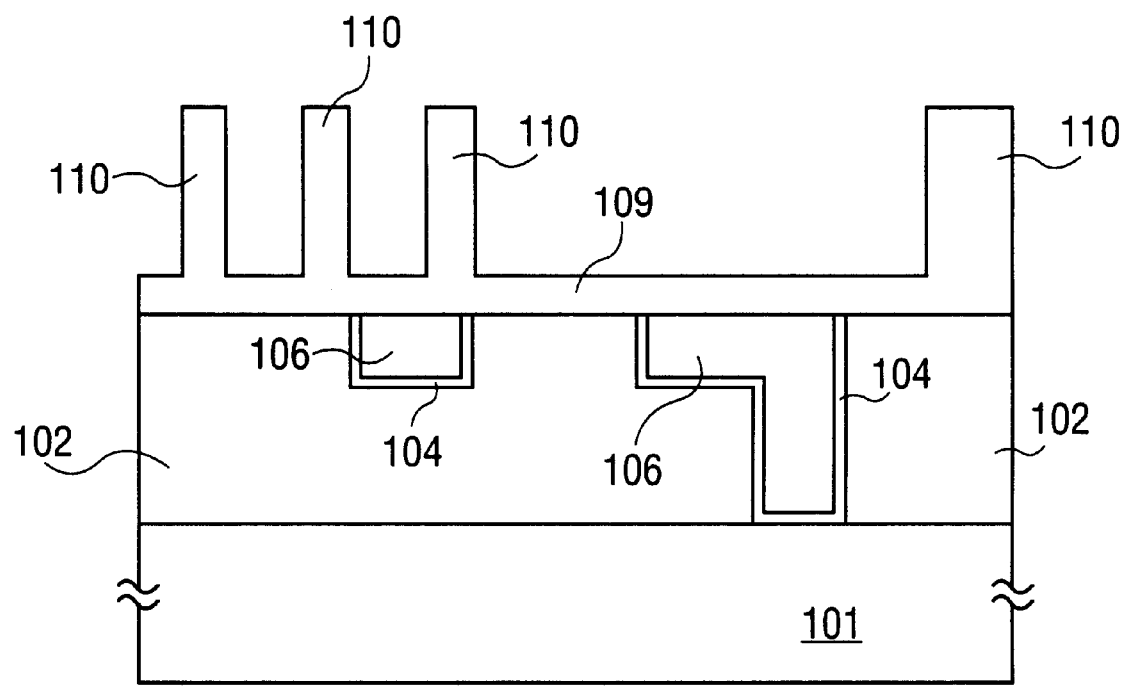
FIG. 5 is a schematic cross-section the structure of FIG. 4, after the thick copper-diffusion barrier layer has been patterned to produce a plurality of reinforcing structures, post in this example, integral with a thin copper-diffusion barrier.

Referring to FIG. 5, the structure of FIG. 4 is shown after thick copper-diffusion barrier or etch stop layer 108 has been patterned to form reinforcing structures 110. In this illustrative embodiment, reinforcing structures 110 are configured as posts. These posts may alternatively be referred to as pillars. Although shown as posts in the illustrated embodiment, various other structures may be patterned, including but not limited to structures such as walls or crosses, as shown in top view in FIG. 6. Methods for patterning the material which comprises thick copper-diffusion barrier or etch stop layer 108 are well known in this field and may include the conventional operations of forming a layer of photoresist, exposing and developing the photoresist, and etching the exposed portions of copper-diffusion barrier or etch stop layer 108 to form posts 110. As shown in FIG. 5, posts 110 have vertical sidewalls indicating an anisotropic etch. However, the invention is not limited to formation of posts 110, or other reinforcing structures, by an anisotropic etch. Mechanical reinforcement structures may also be formed by isotropic etch, or a combination of isotropic and anisotropic etch operations. Those skilled in the art will recognize that isotropic etch chemistries will produce reinforcing structures having tapered, i.e., sloping sidewalls. The locations of posts 110 are selected based, at least in part, on where the interconnect lines and vias are to be formed on that interconnect level. That is, the locations of posts 110 are selected so as to not interfere with the formation of interconnect lines and vias. Additionally, the locations of posts 110 are selected such that, to the extent possible consistent with their reinforcing function, they are spaced away from the interconnect lines because their dielectric constant is higher than that of the low-k dielectric material that will form the bulk of the intralayer dielectric.

Figure 6:
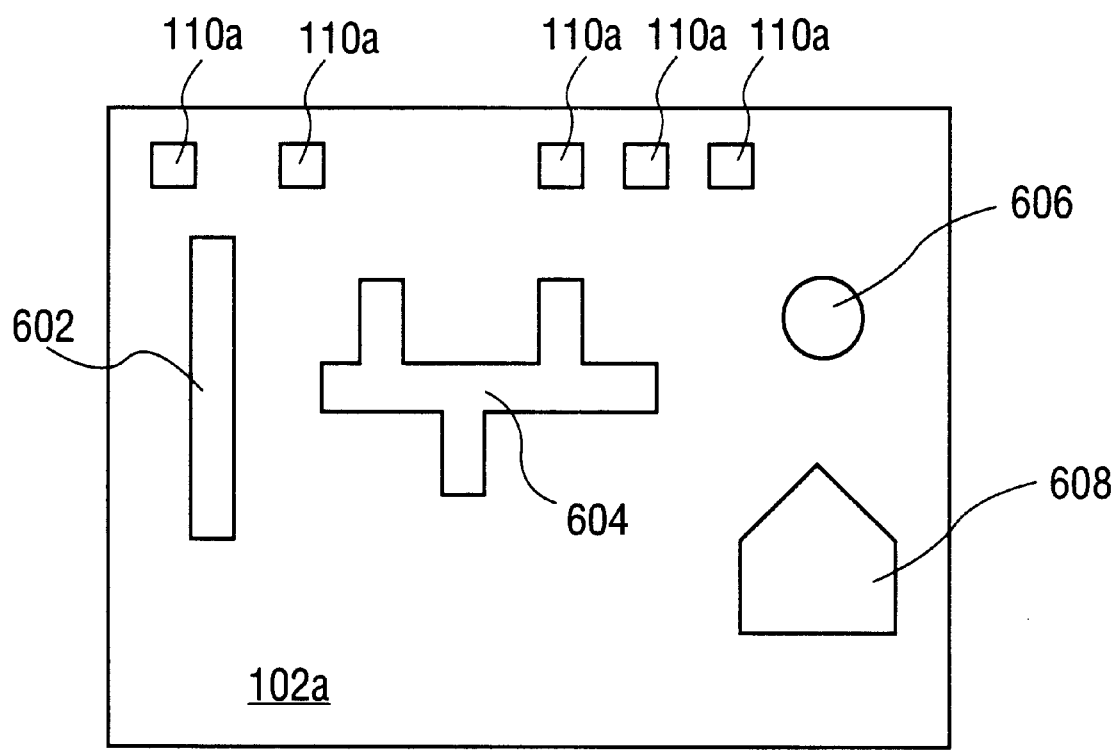
FIG. 6 is a schematic top view of exemplary alternative reinforcement structures in accordance with the present invention.

Referring to FIG. 6, several alternative reinforcing structures in accordance with the present invention are shown. A top view of posts 110 are shown as top surfaces 110a. A top surface 602 corresponds to a wall, or fence-like, structure. Top surface 604 corresponds to a reinforcing structure in the shape of a complex polygon. Top surface 606 corresponds to a post that is cylindrical. Top surface 608 corresponds to yet another alternative embodiment of a reinforcing structure. It will be apparent to those skilled in the art and having the benefit of this disclosure that the reinforcing structures of the present invention are not limited to any particular shape.

Figure 7:
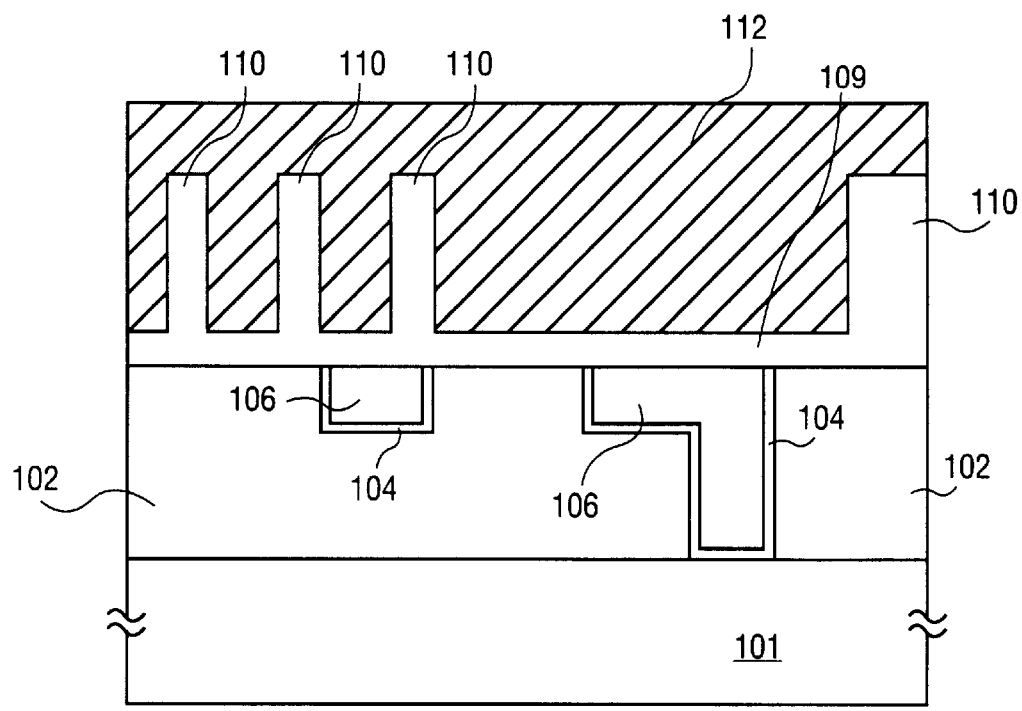
FIG. 7 is a schematic cross-section of the structure of FIG. 5, after a low-k dielectric layer has been formed around and over the reinforcing structures.

Referring to FIG. 7, it can be seen that subsequent to the formation of posts 110, a layer of low-k dielectric material 112 is formed over and around posts 110. In the illustrated example, low-k dielectric material 112 is a porous film such as a mesoporous $SiO_2$, or a polymer, and has a dielectric constant in the range of 1.2 to 2.8. Formation of low-k dielectric material 112 may be achieved through the deposition of material either by chemical vapor deposition (CVD) or by spin-on techniques. Low-k dielectric material 112 is a highly porous material and does not have mechanical strength as great as that of prior art silicon dioxide dielectric layers.

Figure 8:
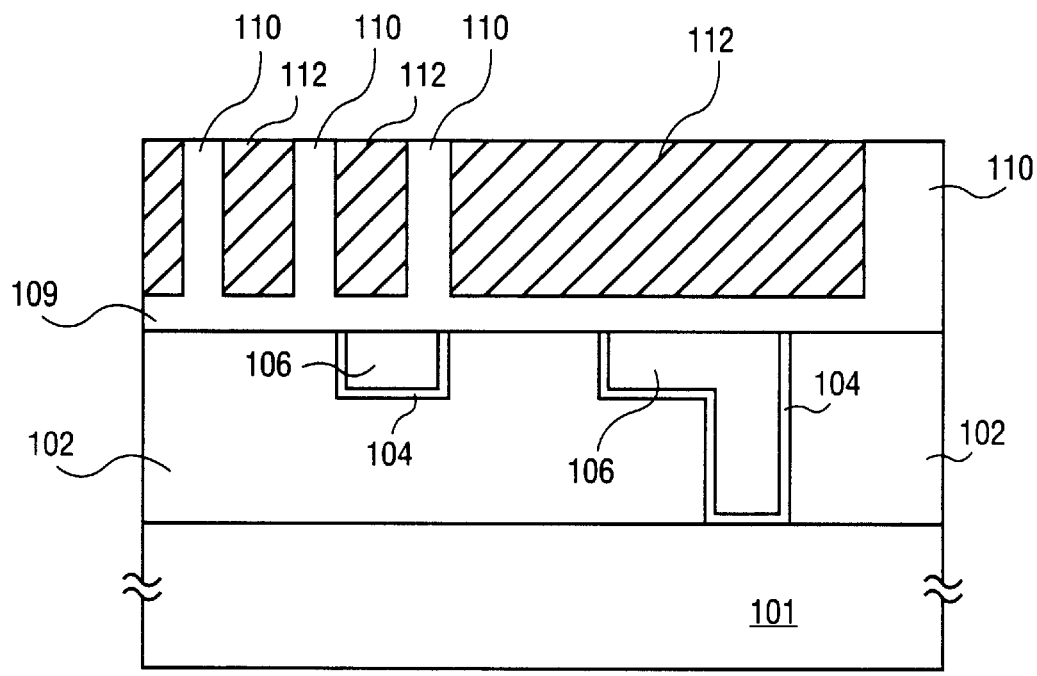
FIG. 8 is a schematic cross-section of the structure of FIG. 7, after the low-k dielectric layer has been planarized.

FIG. 8 shows the structure of FIG. 7, after chemical mechanical polishing has been performed to produce a planarized surface of low-k dielectric material 112 Typically, the post-polish height of low-k dielectric material 112 is substantially equal to the height of posts 110. In otherwords, the post-polish top surface of layer 112 is in the plane of, or within manufacturing tolerances of the plane of the top surface of posts 110. It will be understood that because of the different physical properties of the materials which comprise the posts and the materials which comprise the surrounding dielectric layer, the vertical distances between the top surfaces of the posts and the top surfaces of the dielectric layer may, if so desired, be adjusted to some extent by the polishing process.

Optionally, low-k dielectric material 112 may be subjected to an aging or a curing process in order to increase its porosity. The increased porosity is desirable to reduce the parasitic capacitance between electrical nodes in the integrated circuit which is being manufactured. Posts 110 provide the mechanical strength and stability to withstand the forces encountered during processing steps such as CMP.

Figure 9:
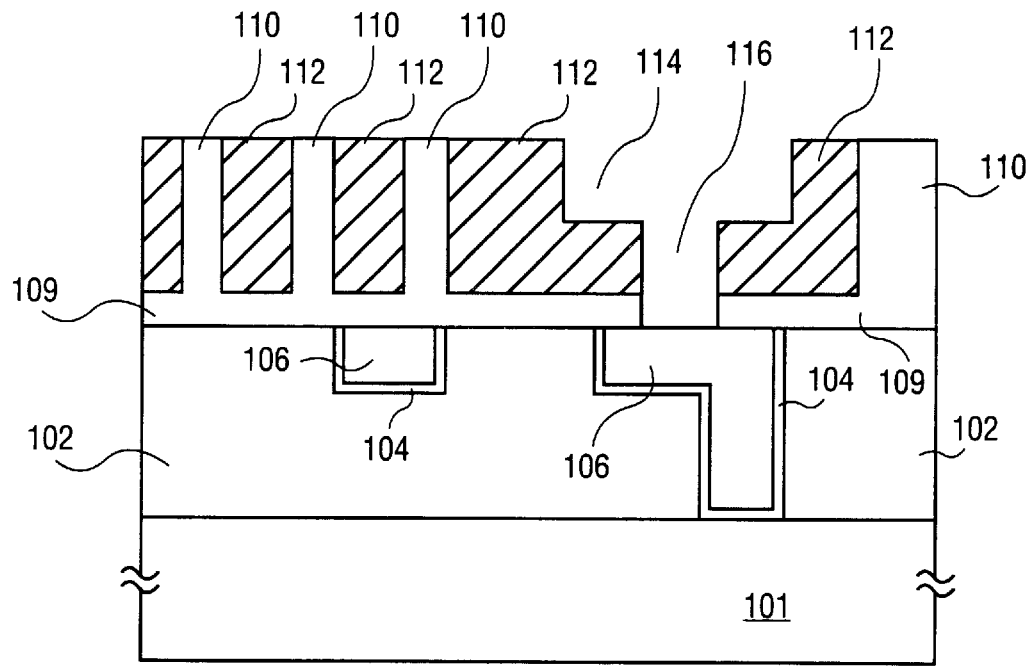
FIG. 9 is a schematic cross-section the of the structure of FIG. 8, after trench and via (i.e., dual damascene) openings have been etched in the low-k dielectric layer, and the via opening has been extended through the thin portion of the copper-diffusion barrier.

FIG. 9 shows the structure of FIG. 8, after trench opening 114, and via opening 116 have been etched into low-k dielectric material 112. Trench opening 114 and via opening 116 are consistent with the damascene method of forming metal interconnections. A metallization process that includes the filling of both trenches and via openings without any substantial intervening process operations is generally referred to as a dual damascene process. The patterning of these damascene trench and via openings is well-documented in the literature of this field and will not be described in greater detail herein.

Figure 10:
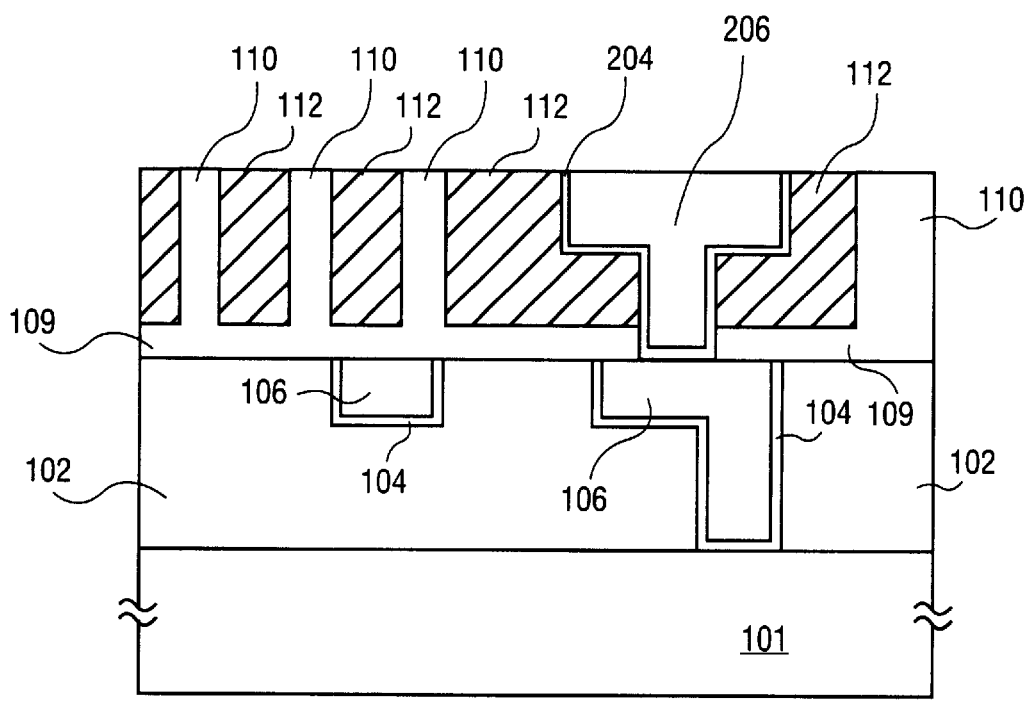
FIG. 10 is a schematic cross-section of the structure of FIG. 9 after the dual damascene openings have had a copper-diffusion barrier formed therein, copper metal has been plated thereon, and excess copper has been removed.

FIG. 10 shows the structure of FIG. 9, after a copper-diffusion barrier 204 is formed upon the surfaces of trench opening 114 and via opening 116. Various copper-diffusion barriers, some electrically conductive and others electrically non-conductive are known. In the illustrated embodiment, copper-diffusion barrier 204 is formed of TiNSi. It should be noted that other materials, including but not limited to, TiN, TaN and Ta may be used. A copper seed layer is formed over barrier 204, and copper 206 is deposited (i.e., plated) so as to fill via opening 116 and trench 114 Excess copper has been removed by chemical mechanical polishing.

Figure 11:
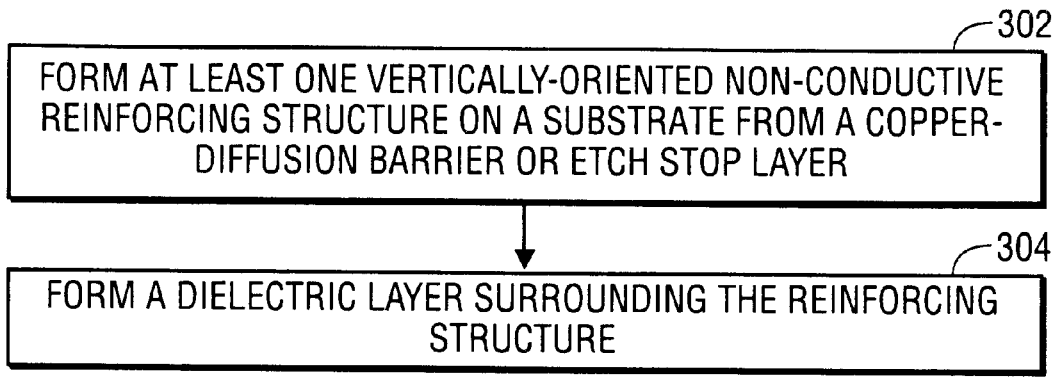
FIG. 11 is a flow diagram illustrating a process in accordance with the present invention.
Figure 12:
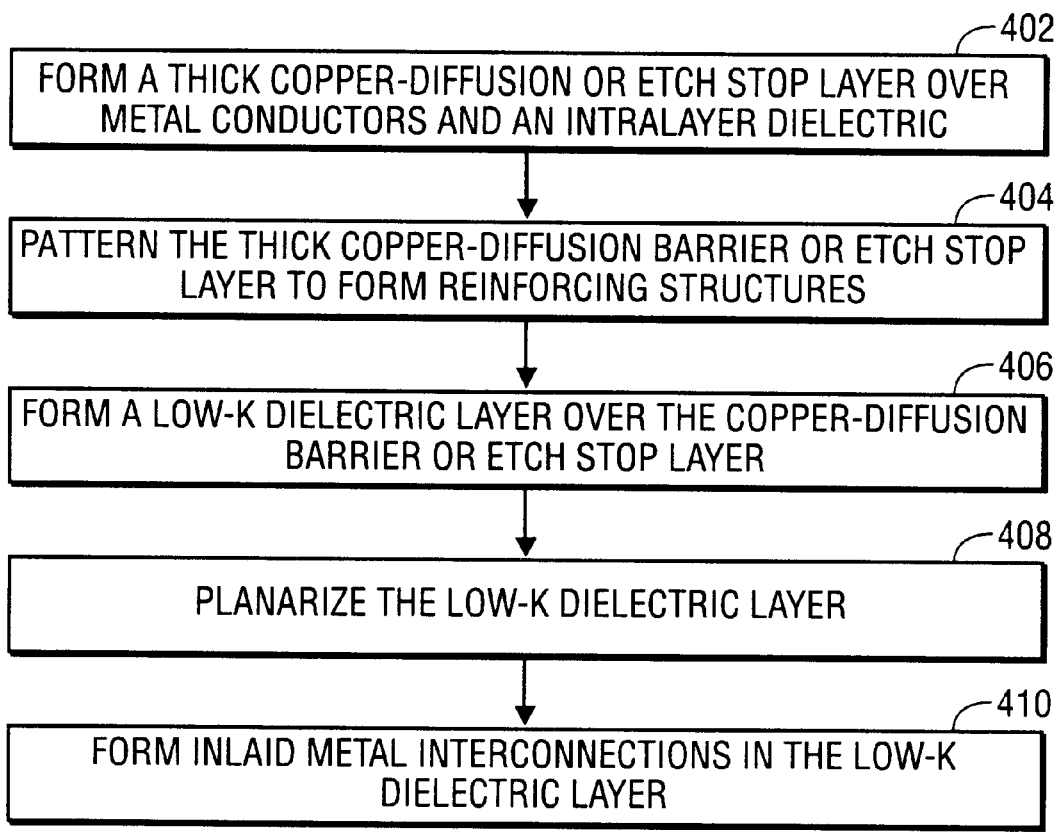
FIG. 12 is a flow diagram illustrating an alternative process in accordance with the present invention.

FIGS. 11–12 are flow diagrams illustrating processes in accordance with the present invention. FIG. 11 illustrates a method of forming a dielectric layer having mechanically reinforcing structures embedded therein. FIG. 12 illustrates a method of forming interconnects on an integrated circuit, including forming a dielectric layer having reinforcing structures therein.

FIG. 11 illustrates a method in which at least one vertically-oriented nonconductive reinforcing structure is formed on a substrate from a copper-diffusion barrier or etch stop layer (302). The posts, or reinforcing structures having other shapes, may be formed from materials including, but not limited to, SiN, SiOC, SiC, and a-CN:H, as long as the materials provide the mechanical reinforcement needed to give strength to the subsequently formed dielectric layer, and as long as they provide the desired function of copper-diffusion barrier and/or etch stop for the via opening etch operation. As indicated above, reinforcing structures, whether shaped as posts, or other geometric forms, may be patterned by conventional photolithographic methods. Subsequently, a dielectric layer, typically a mechanically weak material, such as, but not limited to, a highly porous material, is disposed between the reinforcing structures (304). The highly porous material may be deposited by methods including but not limited to chemical vapor deposition and spin-on techniques. The porosity of such a material may be increased subsequent to deposition by process operations including, but not limited to, curing, and aging.

FIG. 12 illustrates a process including forming a thick copper-diffusion or etch stop layer over metal conductors and an intralayer dielectric (402). This is typically accomplished by forming a copper-diffusion barrier or etch stop layer over a previously formed Cu damascene interconnect level. The thick copper-diffusion barrier or etch stop layer may be formed, as mentioned above, from materials including, but not limited to, SiN, SiOC, SiC, and a-CN:H, as long as the materials provide the mechanical reinforcement needed to give strength to the subsequently formed dielectric layer, and as long as they provide the desired function of copper-diffusion barrier and/or etch stop for the via opening etch operation. The thick copper-diffusion barrier or etch stop layer is then patterned to form one or more reinforcing structures, and a thin copper-diffusion barrier or etch stop layer (404). Conventional photolithographic techniques may be used to pattern the reinforcing structures from the thick copper-diffusion barrier or etch stop layer. A low-k dielectric layer is then formed over and around the reinforcing structures and over the thin portions of the copper-diffusion barrier or etch stop layer (406). The low-k dielectric layer is then planarized, typically by chemical mechanical polishing, so that the top surface of the low-k layer is substantially even with the top surfaces of the reinforcing structures (408). The low-k dielectric layer is typically formed of a material that provides a lower dielectric constant than that of the material which forms the copper-diffusion barrier or etch stop layer. Inlaid metal interconnections are then formed in the low-k dielectric layer in accordance with known damascene metallization techniques (410). That is, trenches, and in some instances trenches and via openings are formed in the low-k dielectric material, and after the formation of any required barrier or seed layers, a metal, such as copper or a copper alloy, is plated in these trenches and via openings. In those instances where via openings are formed in the low-k dielectric layer, the thin portion of the copper-diffusion barrier or etch stop layer which underlies the via openings is, in a separate operation, etched to expose an underlying metal interconnect line.

CONCLUSION

Embodiments of the present invention provide structural support and mechanical reinforcement for low dielectric constant insulators on integrated circuits. Methods, in accordance with one aspect of the present invention, integrate highly porous dielectric materials into Cu damascene interconnect structures by providing reinforcing elements made of the same material as that which forms the copper-diffusion barrier or etch stop layer that overlies the copper-based interconnect lines of the subjacent interconnect level. Those reinforcing elements, or structures, rise vertically through the via and metal layers and thereby provide stability to a mechanical weaker dielectric material which typically has a lower dielectric constant.

An advantage of some embodiments of the present invention which combine mechanically weak but very low dielectric constant material with a mechanically stronger but higher dielectric constant material is that insulator structures with an effective low dielectric constant are achieved which have the necessary mechanical strength to withstand subsequent processing operations, such as, chemical mechanical polishing.

A further advantage of some embodiments of the present invention is that the reinforcing structures provide a greater degree of thermal conduction than is possible with a highly porous dielectric material alone. In this way, the reinforcing structures provide the benefit of conducting heat away from the circuit elements of an integrated circuit such as, for example, resistors, diodes, and transistors.

The present invention may be implemented with various changes and substitutions to the illustrated embodiments. For example, the present invention may be implemented on substrates comprised of materials other than silicon, such as, for example, gallium arsenide or sapphire. Similarly, the present invention may be implemented with various alloys of copper forming the metal interconnect lines.

It will be readily understood by those skilled in the art that various other changes in the details, materials, and arrangements of the parts and operations which have been described and illustrated in order to explain the nature of this invention may be made without departing from the principles and scope of the invention as expressed in the subjoined Claims.

What is claimed is:

1. A process, comprising:

forming an electrically non-conductive copper-diffusion barrier layer having a first thickness on a substrate;

patterning the copper-diffusion barrier layer such that a plurality of spaced apart posts are formed, each post having a top surface, and such that the copper-diffusion barrier has a second, non-zero, thickness in spaces between the spaced apart posts;

forming a dielectric layer over and adjacent to the posts, the dielectric layer having a top surface; and removing a portion of the dielectric layer such that its top surface is substantially even with the top surfaces of the posts.

2. The process of claim 1, wherein the substrate comprises a plurality of spaced apart copper-based interconnect lines and electrically insulating material disposed between the spaced apart copper-based interconnect lines.

3. The process of claim 2, wherein the copper-diffusion barrier layer is a material selected from the group consisting of SiC, SiN, a-CN:H and carbon doped oxides of silicon.

4. The process of claim 2, further comprising curing the dielectric layer.

5. The process of claim 2, further comprising aging the dielectric layer.

6. The process of claim 2, further comprising forming trenches and via openings in the dielectric layer.

7. The process of claim 6, wherein forming the dielectric layer comprises depositing an oxide of silicon.

8. The process of claim 6, wherein forming the dielectric layer comprises chemical vapor deposition of a low-k material.

9. The process of claim 6, wherein forming the dielectric layer comprises spinning on a low-k material.

10. The process of claim 1, wherein the dielectric layer has a lower dielectric constant than that of the copper-diffusion barrier layer.

11. A process, comprising:

depositing a first layer having a first thickness on a wafer;

patterning the first layer such that a plurality of reinforcing structures extend from a base portion of the first layer, the base portion having a second thickness which is less than the first thickness, and the structures each have a top surface;

depositing a porous dielectric material over and adjacent to the reinforcing structures, the porous dielectric material having a void fraction; and polishing the porous dielectric material such that a top surface thereof is substantially even with the top surfaces of the structures; and treating the porous dielectric material such that the void fraction is increased.

12. The process of claim 11, wherein the porous dielectric material has a lower dielectric constant than that of the reinforcing structures.

* * * * *